United States Patent
Dramstad et al.

[11] Patent Number: 6,004,139
[45] Date of Patent: Dec. 21, 1999

[54] MEMORY MODULE INTERFACE CARD ADAPTER

[75] Inventors: Kent A. Dramstad, Essex Junction; Steven A. Grundon, Underhill; Jeffrey N. Ohler, Colchester, all of Vt.

[73] Assignee: International Business Machines Corporation, Armonk, N.Y.

[21] Appl. No.: 08/881,497

[22] Filed: Jun. 24, 1997

[51] Int. Cl.⁶ .................................................. H01R 9/09
[52] U.S. Cl. ............................... 439/59; 439/61; 361/760
[58] Field of Search .................... 439/65, 67; 364/953.3; 361/785, 788, 803, 802, 784, 741; 395/282, 281

[56] References Cited

U.S. PATENT DOCUMENTS

| | | | |
|---|---|---|---|
| 4,954,086 | 9/1990 | Hill et al. | 439/65 |
| 4,993,965 | 2/1991 | Eck | 439/374 |
| 5,167,511 | 12/1992 | Krajewski | 439/61 |
| 5,184,282 | 2/1993 | Kaneda et al. | 439/62 |
| 5,357,624 | 10/1994 | Laven | 395/425 |
| 5,524,232 | 6/1996 | Hajeer | 395/442 |
| 5,530,623 | 6/1996 | Sanwo et al. | 361/788 |
| 5,604,871 | 2/1997 | Pecone | 395/281 |
| 5,703,759 | 12/1997 | Trimberger | 361/777 |
| 5,867,419 | 2/1999 | Chengson et al. | 365/65 |

OTHER PUBLICATIONS

IBM, Memory Card Adaptor with Direct Set–up Transformer IBM Technical Disclosure Bultin, 141, 142, Oct. 1997.

*Primary Examiner*—Steven L. Stephan
*Assistant Examiner*—J. F. Duverne
*Attorney, Agent, or Firm*—Thornton & Thornton; Francis J. Thornton; Robert A. Walsh

[57] ABSTRACT

This discloses a memory module adapter card that allows newer dual in-line memory modules (DIMMs) to be used by computer system boards that were built to use older single inline memory modules (SIMMs) thereby permitting computer owners to update and upgrade older machines without modifying or changing their system boards. This memory module adapter card is designed to connect a memory DIMM inserted into a DIMM socket, carried thereon, to a pair of smaller SIMM sockets on a computer system board such that the DIMM appears to the computer as a pair of the smaller SIMMs that the board was originally designed for. This decreases the need for manufacturing and maintaining an inventory of the older SIMMs and provides owners of older computers the means to extend the useful life of their existing computer system even if the SIMMs designed for the computer no longer exist or are prohibitively expensive or very difficult to locate.

5 Claims, 8 Drawing Sheets

| 14a | | 14b | |
|---|---|---|---|
| RAS0* | DQ0 | PD3 | DQ40 |
| RAS1* | DQ1 | PD4 | DQ41 |
| RAS2* | DQ2 | PD5 | DQ42 |
| RAS3* | DQ3 | PD6 | DQ43 |
|  | DQ4 | PD7 | DQ44 |
| CAS0* | DQ5 | PD8 | DQ45 |
| CAS1* | DQ6 | ID0 | DQ46 |
| CAS2* | DQ7 | ID1 | DQ47 |
| CAS3* | DQ8 |  | DQ48 |
| CAS4* | DQ9 |  | DQ49 |
| CAS5* | DQ10 |  | DQ50 |
| CAS6* | DQ11 |  | DQ51 |
| CAS7* | DQ12 |  | DQ52 |
|  | DQ13 |  | DQ53 |
| WE0* | DQ14 |  | DQ54 |
| WE2* | DQ15 |  | DQ55 |
|  | DQ16 |  | DQ56 |
| OE0* | DQ17 |  | DQ57 |
| OE2* | DQ18 |  | DQ58 |
|  | DQ19 |  | DQ59 |
| A0 | DQ20 |  | DQ60 |
| B0 | DQ21 |  | DQ61 |
| A1 | DQ22 | VCC: 6, 18, 26, 40, | DQ62 |
| A2 | DQ23 | 49, 59, 73, 84, | DQ63 |
| A3 | DQ24 | 90, 102, 110, | DQ64 |
| A4 | DQ25 | 124, 133, 143, | DQ65 |
| A5 | DQ26 | 157, 168 | DQ66 |
| A6 | DQ27 |  | DQ67 |
| A7 | DQ28 | GND: 1, 12, 23, 32, | DQ68 |
| A8 | DQ29 | 43, 54, 68, 78, | DQ69 |
| A9 | DQ30 | 116, 127, 138, | DQ70 |
| A10 | DQ31 | 152, 162 | DQ71 |
| A11 | DQ32 |  | DQ72 |
| A12 | DQ33 | NC: 41, 42, | DQ73 |
| A13 | DQ34 | 61, 62, | DQ74 |
|  | DQ35 | 63, 64, | DQ75 |
| PDE* | DQ36 | 111, 115, | DQ76 |
|  | DQ37 | 125, 128, | DQ77 |
| PD1 | DQ38 | 145, 146, | DQ78 |
| PD2 | DQ39 | 147, 148 | DQ79 |

FIG. 3b

Pin Description

| | |
|---|---|
| RAS0, RAS2 | Row Address Strobe (16MB) |
| RAS0–RAS3 | Row Address Strobe (32MB) |
| CAS0–CAS3 | Column Address Strobe |
| WE | Read/write Input |
| A0–A10 | Address Inputs |
| DQ0–7, 9–16, 18–25, 27–34 | Data Input/output |
| Vcc | Power (+5V) |
| Vss | Ground |
| NC | No Connect |
| PD1–PD4 | Presence Detects |

Pinout

| Pin # | Name | Pin # | Name | Pin # | Name |
|---|---|---|---|---|---|
| 1 | Vss | 25 | DQ24 | 49 | DQ9 |
| 2 | DQ0 | 26 | DQ7 | 50 | DQ27 |
| 3 | DQ18 | 27 | DQ25 | 51 | DQ10 |
| 4 | DQ1 | 28 | A7 | 52 | DQ28 |
| 5 | DQ19 | 29 | NC | 53 | DQ11 |
| 6 | DQ2 | 30 | Vcc | 54 | DQ29 |
| 7 | DQ20 | 31 | A8 | 55 | DQ12 |
| 8 | DQ3 | 32 | A9 | 56 | DQ30 |
| 9 | DQ21 | 33 | RAS3 | 57 | DQ13 |
| 10 | Vcc | 32 | RAS2 | 58 | DQ31 |
| 11 | NC | 35 | NC | 59 | Vcc |
| 12 | A0 | 36 | NC | 60 | DQ32 |
| 13 | A1 | 37 | NC | 61 | DQ14 |
| 14 | A2 | 38 | NC | 62 | DQ33 |
| 15 | A3 | 39 | Vss | 63 | DQ15 |
| 16 | A4 | 40 | CAS0 | 64 | DQ34 |
| 17 | A5 | 41 | CAS2 | 65 | DQ16 |
| 18 | A6 | 42 | CAS3 | 66 | NC |
| 19 | A10 | 43 | CAS1 | 67 | PD1 |
| 20 | DQ4 | 44 | RAS0 | 68 | PD2 |
| 21 | DQ22 | 45 | RAS1 | 69 | PD3 |
| 22 | DQ5 | 46 | NC | 70 | PD4 |
| 23 | DQ23 | 47 | WE | 71 | NC |
| 24 | DQ6 | 48 | NC | 72 | Vss |

Pin Description

| RAS0, RAS2 | Row Address Strobe | DQx | Data Input/Output | DU | Don't Use |
|---|---|---|---|---|---|
| CAS0–CAS7 | Column Address Strobe | CBx | Check Bit Data Input/Output | SCL | Derial Presence Detect Clock Input |
| WE0, WE2 | Read/write Input | Vcc | Power (3.3V) | SDA | Derial Presence Detect Data Input |
| OE0, OE2 | Output Enable | Vss | Ground | SA0-2 | Derial Presence Detect Address Inputs |
| A0–A9 | Address Inputs | NC | No Connect | | |

Pinout

| Pin # | Front Side | Pin # | Back Side | Pin # | Front Side | Pin # | Back Side | Pin # | Front Side | Pin # | Back Side |
|---|---|---|---|---|---|---|---|---|---|---|---|
| 1 | Vss | 85 | Vss | 22 | CB1 | 106 | CB5 | 43 | Vss | 127 | Vss |
| 2 | DQ0 | 86 | DQ32 | 23 | Vss | 107 | Vcc | 44 | OE2 | 128 | DU |
| 3 | DQ1 | 87 | DQ33 | 24 | NC | 108 | NC | 45 | RAS2 | 129 | NC |
| 4 | DQ2 | 88 | DQ34 | 25 | NC | 109 | NC | 46 | CAS2 | 130 | CAS6 |
| 5 | DQ3 | 89 | DQ35 | 26 | Vcc | 110 | Vcc | 47 | CAS3 | 131 | CAS7 |
| 6 | Vcc | 90 | Vcc | 27 | WE0 | 111 | DU | 48 | WE2 | 132 | DU |
| 7 | DQ4 | 91 | DQ36 | 28 | CAS0 | 112 | CAS4 | 49 | Vcc | 133 | Vcc |
| 8 | DQ5 | 92 | DQ37 | 29 | CAS1 | 113 | CAS5 | 50 | NC | 134 | NC |
| 9 | DQ6 | 93 | DQ38 | 30 | RAS0 | 114 | NC | 51 | NC | 135 | NC |
| 10 | DQ7 | 94 | DQ39 | 31 | OE0 | 115 | DU | 52 | CB2 | 136 | CB6 |
| 11 | DQ8 | 95 | DQ40 | 32 | Vss | 116 | Vss | 53 | CB3 | 137 | CB7 |
| 12 | Vss | 96 | Vss | 33 | A0 | 117 | A1 | 54 | Vss | 138 | Vss |
| 13 | DQ9 | 97 | DQ41 | 34 | A2 | 118 | A3 | 55 | DQ16 | 139 | DQ48 |
| 14 | DQ10 | 98 | DQ42 | 35 | A4 | 119 | A5 | 56 | DQ17 | 140 | DQ49 |
| 15 | DQ11 | 99 | DQ43 | 36 | A6 | 120 | A7 | 57 | DQ18 | 141 | DQ50 |
| 16 | DQ12 | 100 | DQ44 | 37 | A8 | 121 | A9 | 58 | DQ19 | 142 | DQ51 |
| 17 | DQ13 | 101 | DQ45 | 38 | NC | 122 | NC | 59 | Vcc | 143 | Vcc |
| 18 | Vcc | 102 | Vcc | 39 | NC | 123 | NC | 60 | DQ20 | 144 | DQ52 |
| 19 | DQ14 | 103 | DQ46 | 40 | Vcc | 124 | Vcc | 61 | NC | 145 | NC |
| 20 | DQ15 | 104 | DQ47 | 41 | Vcc | 125 | DU | 62 | DU | 146 | DU |
| 21 | CB0 | 105 | CB4 | 42 | DU | 126 | DU | 63 | NC | 147 | NC |

| Pin # | Front Side | Pin # | Back Side |
|---|---|---|---|
| 64 | Vss | 148 | Vss |
| 65 | DQ21 | 149 | DQ53 |
| 66 | DQ22 | 150 | DQ54 |
| 67 | DQ23 | 151 | DQ55 |
| 68 | Vss | 152 | Vss |
| 69 | DQ24 | 153 | DQ56 |
| 70 | DQ25 | 154 | DQ57 |
| 71 | DQ26 | 155 | DQ58 |
| 72 | DQ27 | 156 | DQ59 |
| 73 | Vcc | 157 | Vcc |
| 74 | DQ28 | 158 | DQ60 |
| 75 | DQ29 | 159 | DQ61 |
| 76 | DQ30 | 160 | DQ62 |
| 77 | DQ31 | 161 | DQ63 |
| 78 | Vss | 162 | Vss |
| 79 | NC | 163 | NC |
| 80 | NC | 164 | NC |
| 81 | NC | 165 | SA0 |
| 82 | SDA | 166 | SA1 |
| 83 | SC1 | 167 | SA2 |
| 84 | Vcc | 168 | Vcc |

Note: All pin assignments are consistent for all 8 Byte unbuffered versions

MEMORY MODULE INTERFACE CARD ADAPTER

FIELD OF THE INVENTION

This invention relates generally to computer memories. More particularly, the invention relates to a computer card, configured to permit the interfacing and use of large memory modules in computers having module sockets designed for small memory modules thus permitting a computer's memory to be upgraded even when the memory sockets in the computer can not receive the large memory modules.

BACKGROUND OF THE INVENTION

Computers use numerous memory units such as Dynamic Random Access Memory units (DRAM)s for the storage of and retrieval of data. Initially computers used individual memory units mounted directly onto the computers main board, i.e., the system or mother board. As computers, and the programs used therein, increased in size and complexity, more and faster memory units were required and the system boards could not accommodate a sufficient number of individual memory units.

The initial solution to this problem was to create a memory module, formed of a plurality of individual memory units. These memory modules are still in use and known as Single In-line Memory Modules, herein after referred to as SIMMS. To accommodate these SIMMs, suitable sized sockets were provided on the system board. The use of these SIMMs and accommodating sockets significantly expanded the memory capacity of the computer. Initially the SIMMs were designed as 30 pin, 8 bit wide devices which mated with a suitable 30 pin female socket. Soon however increasing computer memory demands saw the introduction of a memory module extender which permitted single 30 pin SIMM sockets to receive a plurality of 30 pin SIMMs.

However industry advances saw the introduction of a faster, enlarged memory 72 Pin, 32 bit wide SIMM which required a mating 72 pin socket.

With these changes, the owners of older computers were again faced with either the foregoing of the advantages of these new 72 pin, 32 bit wide SIMMs or buying new computers.

A solution to this problem was the design of a memory module adaptor that was configured to permit a plurality of 30 pin 8 bit SIMMs to function as a single high order 72 pin, 32 bit SIMM.

Although the above solutions proved viable, the appetite of the computer industry for more and faster memory continues unabated.

To meet these further higher memory demands, 168 pin, 64 bit Dual In-line Memory Modules, hereinafter referred to as DIMMs, which require 168 pin sockets are now the industry standard. These DIMMs cannot be accommodated by either the 30 pin 8 bit or the 72 pin 32 bit SIMM sockets.

Accordingly the owners of older computers are faced, once again, with the choice of either foregoing the advantages of the new memory assemblies or buying new computers.

To further complicate the issue, the module manufacturers find that, to accommodate industry demands for the newer DIMMs, the production of the older SIMMs must be curtailed in favor of the newer DIMMs.

Thus there exists a need for a means of permitting older computers having, on their system boards, either 30 pin, 8 bit or 72 pin, 32 bit sockets to accept the newer 168 pin, 64 bit DIMMs thereby permitting the owners of older computers to upgrade these older machines and take advantage of the newer technology and programs.

SUMMARY OF THE INVENTION

The present invention is directed to a solution to this problem that permits computer owners to use the new larger, main stream, high volume, low cost dual in-line memory modules (DIMMs), to update and upgrade older machines with current technology without modifying or changing their system boards. Thus the owners of older machines can avoid the necessity of having their computers obsolesced.

The present invention permits high density DIMM memory assemblies to be plugged into computer systems that hitherto could only accommodate older, lower density assemblies.

The present invention accomplishes this by providing a memory module card adapter, configured to permit the interfacing and use of large memory modules in computers having module sockets designed for small memory modules. This permits a large pin count DIMM to interface with the computer via the older and now obsolete SIMM sockets. The DIMM is thus presented to the computer such that the computer acts as if the DIMM were a multiplicity of the SIMMs that the older computer was originally designed for.

In the preferred embodiment, the invention uses a memory module card adapter, designed to carry a DIMM module, which can be plugged into a plurality of SIMM sockets thus permitting the DIMM to emulate a plurality of SIMMs.

The present invention thus not only decreases the need for manufacturing and maintaining an inventory of the older outdated SIMM modules but also provides users of older computers with the capability of extending the useful life of their existing computer system even though the SIMMs or memory expansion cards designed for the computer no longer exist or are prohibitively expensive or very difficult to locate.

Accordingly, it is an object of the invention to provide a memory module card adapter which will permit a given computer system interface to interact with a different style interface, not hitherto adaptable to the computer system interface, thus permitting older computers to make use of current mainstream, high volume low cost memory expansion cards or memory modules.

These and other objects and features of the present invention will become further apparent from the following description taken in conjunction with the drawings.

BRIEF DESCRIPTION OF THE DRAWINGS

FIG. 3b is a further partial schematic showing the interconnections of two 72 pin SIMM sockets to a 168 DIMM socket.

FIG. 4 shows the actual pin description and pinout for a 72 pin SIMM socket.

FIG. 5 shows the actual pin description and pinout for a 168 pin DIMM socket.

DESCRIPTION OF THE PREFERRED EMBODIMENT

Figure 1:
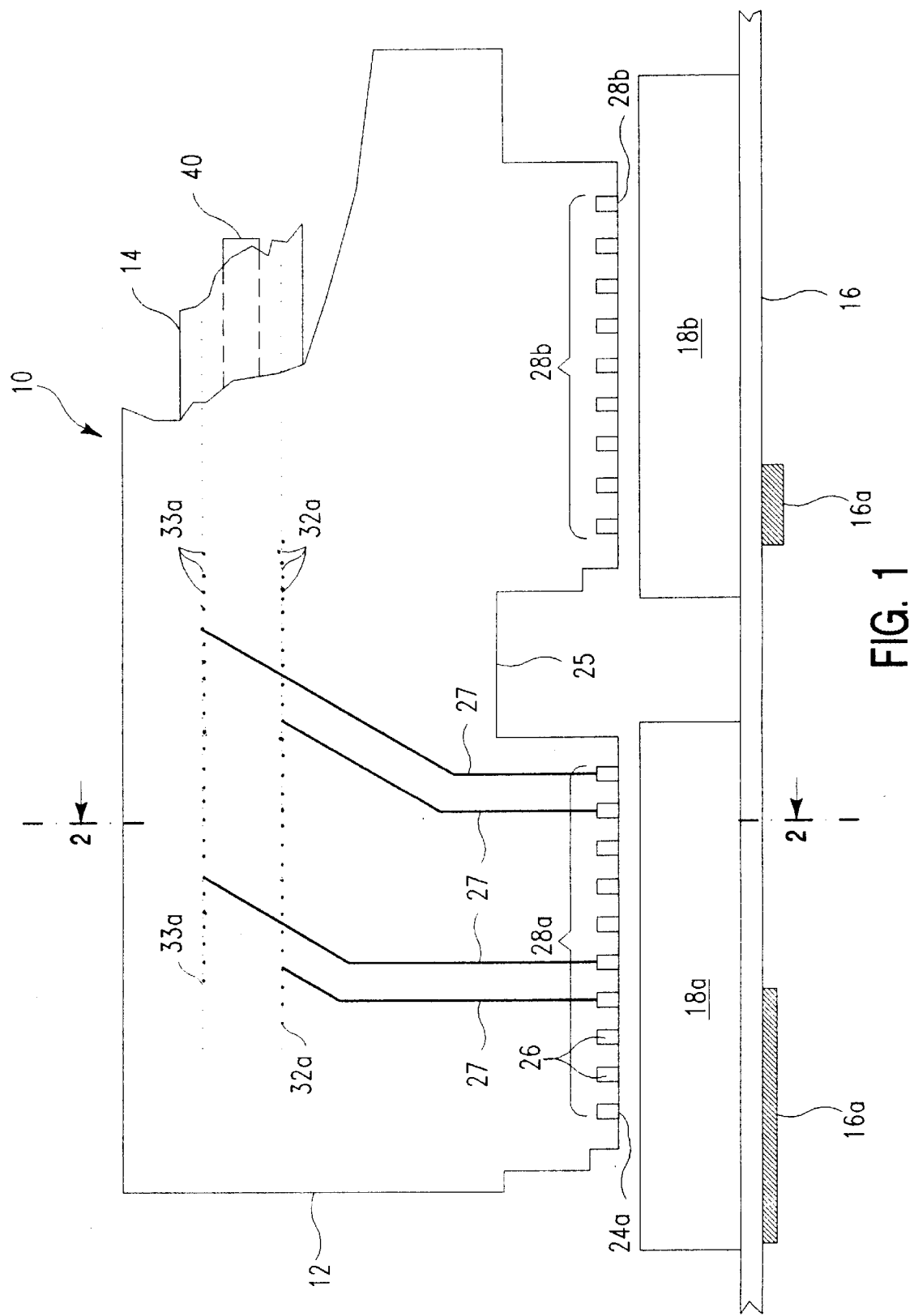
FIG. 1 is a view of the present invention wherein the memory module card adapter, of the present invention, is shown coupling a 168 pin DIMM to a computer system board having two 72 pin SIMM sockets mounted end to end thereon.
Figure 2:
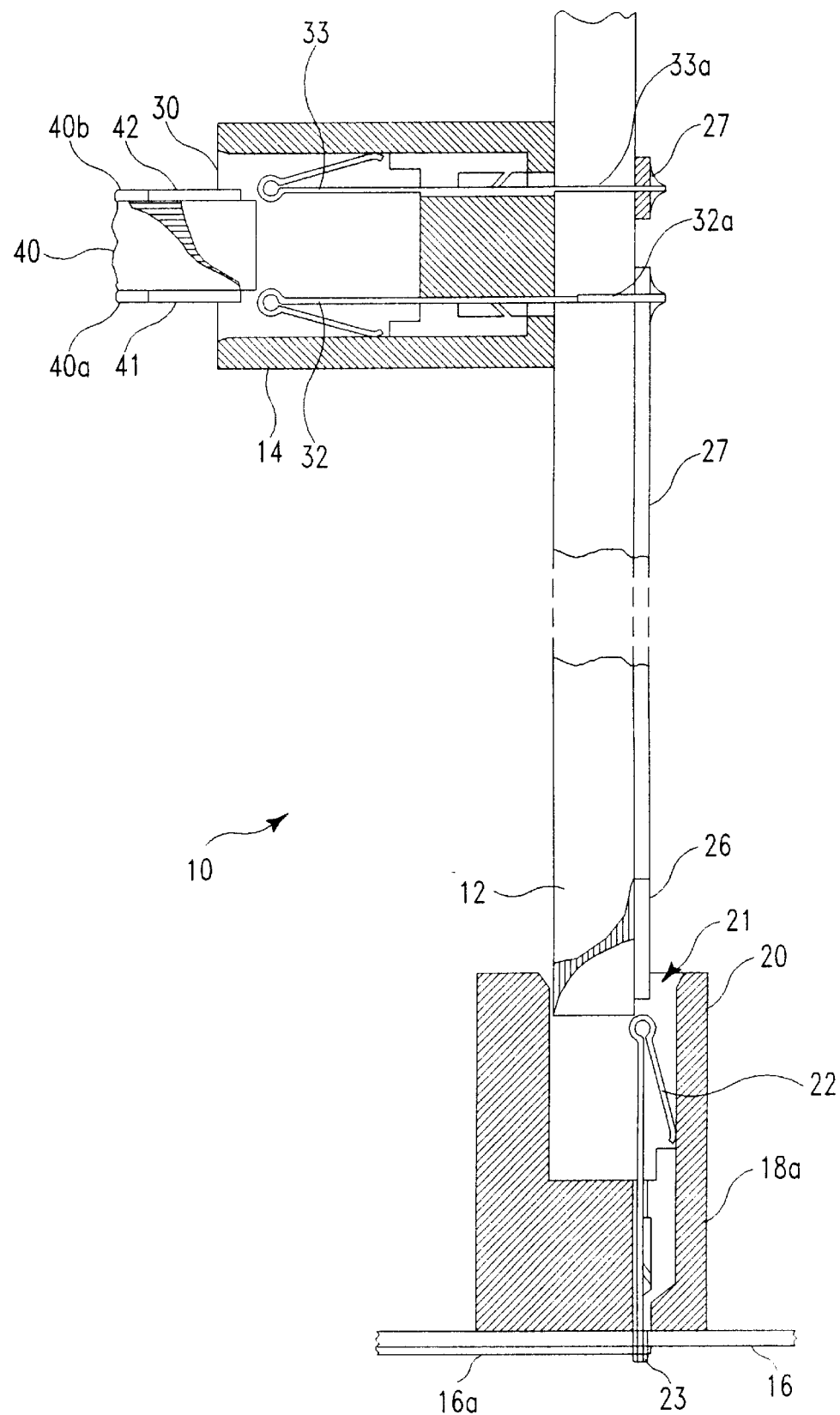
FIG. 2 is a sectional view of FIG. 1 taken along the lines 2—2.

Referring now to FIGS. 1 to 3 an embodiment of the memory module card adapter of the present invention for coupling a 168 pin DIMM to a computer system board via two 72 pin SIMM sockets mounted end-to-end on the computer system or mother board will be described.

FIG. 1 is a plan view of the present invention which comprises a memory module card adapter 10, in the form of a printed card 12, carrying a standard JEDEC (Joint Electron, Device and Engineering Council) 168 pin DIMM socket 14 into which a 168 pad DIMM module may be inserted.

As is well known to the art, JEDEC sets standards for electronic devices such as modules and sockets for electronic equipment. The card 12 has one edge designed to couple to a pair of identical standard 72 pin SIMM sockets 18a and 18b mounted in line, i.e., end to end, on a computer's system board 16.

The SIMM sockets 18a and 18B are identical and are positioned a specified distance apart. Each socket, 18a, 18b is comprised of an elongated housing 20, formed of an insulating material, and as shown in FIG. 2 has a slot or recess 21 adapted to receive a SIMM. As shown in FIG. 2, the SIMM socket is provided with a set of spring contacts 22 positioned along one inner wall of the recess 21. These contacts 22 have a JEDEC specified pitch, number and spacing identical to the number and spacing, i.e., the pitch, of the contact pads in a standard SIMM. These spring contacts thus are designed and adapted for mating with and contacting pads on the SIMM. Each contact 22, is secured in the socket by suitable mechanical means and each has an extended tail 23 for passing through the computer system board 16 so that it may be connected to suitable wires 16a formed on the system board 16.

The printed circuit card 12 forming the memory module card adapter of the present invention, in this embodiment, has a generally rectangular shape and provides structural support for the 168 pin DIMM socket 14 mounted thereon. The printed circuit card 12, is formed of an insulating material and has one side divided, by a slot 25, into two equal parts 24a and 24b. The edge of each such equal part 24a, 24b has respective sets 28a, 28b of I/O pads 26 thereon. Each part 24a, 24b and the sets of pads thereon are defined to mate with the standard 72 pin JEDEC SIMM sockets 18a and 18b on board 16.

Each spring contact 22 has its upper end generally rounded so that it will provide a spring action which will force each contact 22 against a respective pad 26 on the card 12. This rounded end, on each contact, wipes each respective pad 26 that it bears against as the card is pushed into the recess. This wiping removes oxides or other films on the surface of the spring contact and its respective pad and thereby ensures a better electrical contact between each contact and its respective pad.

From each pad 26 there extends a respective wire 27, of which only a representative few are shown. Each wire 27 is connected, at one end to a pad 26 and at its other or terminal end, to respective contacts in the DIMM socket 14 as will be discussed below.

As shown in FIG. 2, the DIMM socket 14 has a recess 30 therein containing parallel, I. e., first and second, sets of spring contacts 32 and 33. Each set of spring contacts is respectively positioned along a respective inner wall of the recess. The contacts in each set are, of course, spaced, i.e., have a JEDEC established pitch that is complementary to the pitch of the pads on a DIMM.

DIMMs are well known to the art and generally are formed of rectangular printed circuit cards 40 having various memory and support circuit chips (not shown) mounted thereon that are appropriately connected, via wiring 40a and 40b, to a plurality of I/O pads 41 and 42 arranged along one edge of the DIMM and on both sides thereof.

Each of the contacts 32 and 33 in the DIMM socket 14 is secured in the socket by suitable mechanical means by extended tails 32a and 33a for passing through the computer adapter card 12 and for connection to the wires 27 thereon. Each of the contacts 32 and 33 also have their upper ends formed in a generally rounded shape to provide a wiping action between these contacts and the pads, 41 on the DIMM 40 as the DIMM is pushed into the recess 30. Again this wiping ensures a good electrical contact between these contacts and the respective pads on the DIMM.

Figure 3A:
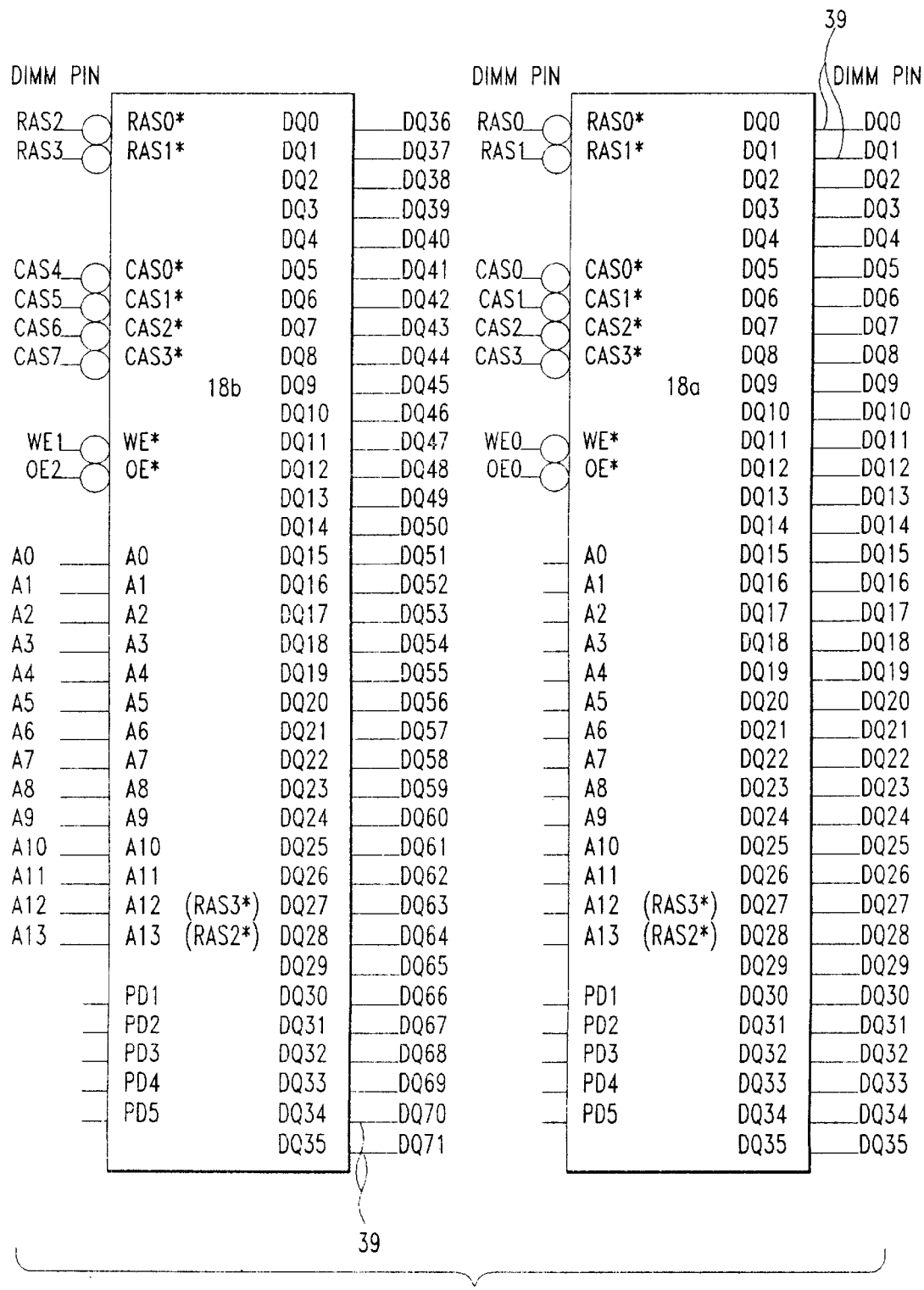
FIG. 3a is a partial schematic of how the outputs of a pair of 72 pin SIMMs can be connected to a 168 pin DIMM.

FIG. 3a is a partial schematic of how the outputs of a pair of 72 pin SIMM connectors 18a and 18b can be connected to the 168 DIMM socket 14 and FIG. 3b is a further partial schematic showing the interconnections of the two 72 pin SIMM sockets 18a and 18b to the 168 DIMM socket 14.

As shown in FIG. 3a each SIMM socket 18a and 18b has 36 data contacts marked DQ0 through DQ35. Additionally each SIMM socket 18a, 18b has a plurality of signal pins marked RAS0, RAS1, CAS0 through CAS3, WE, OE, A0 through A11, and PD1 through PD4. Still other contacts provide ground and voltage contacts.

As noted above, the Memory module card adapter 12, of FIG. 1, has a wiring diagram, formed of wires 27, thereon such that when the separated edge parts 24a, 24b are inserted into the respective SIMM sockets 18a and 18b an electrical path is created between each contact in each SIMM socket 18a and 18b to a respective contact in the DIMM socket 14. A schematic representation of the DIMM socket 14 contacts is set forth in FIG. 3B.

As shown in FIG. 3a, the connective path between each contact in each SIMM socket 18a, 18b to its respective contact in the DIMM socket 14 is indicated by the lines 39 extending from the schematically depicted contacts in the SIMM sockets 18a and 18b to the marked contact pin in the DIMM socket 14. For example, in this FIG. 3a the data pins DQ0 through DQ35 of socket 18a are connected by the memory module card adapter card to pins DQ0 through DQ35 of the DIMM socket 14 respectively while the data pins DQ0 through DQ35 of socket 18b are connected by the memory module card adapter card to pins DQ36 through DQ71 of the DIMM socket 14 respectively. The other pin connections are also appropriately marked in both these FIGS. 3a and 3b and in any event can now be readily determined by one skilled in the art especially in view of FIG. 4 which shows the actual pin description and pinout for a 72 pin SIMM socket and FIG. 5 which shows the actual pin description and pinout for a 168 pin DIMM socket.

Figure 6:
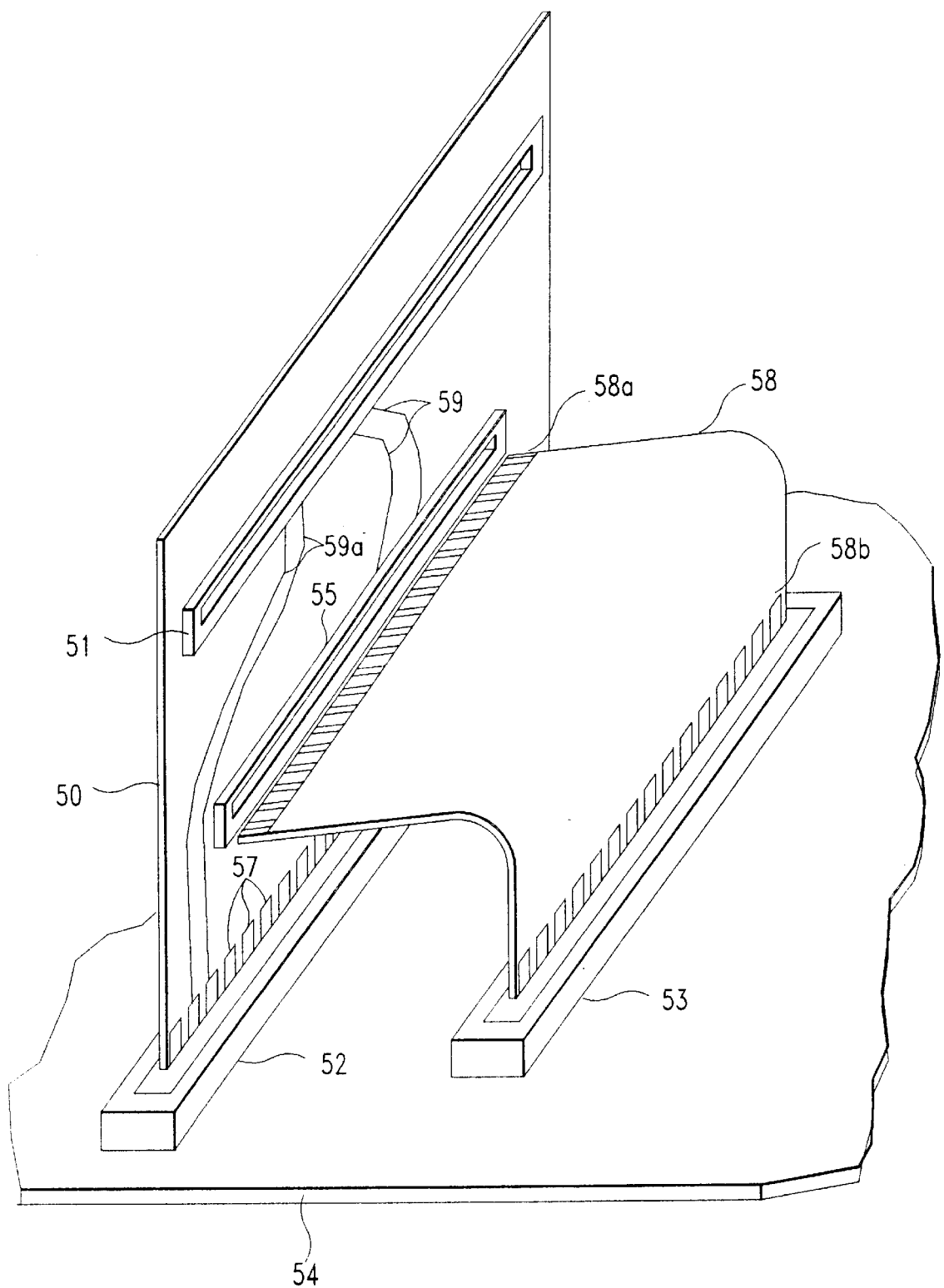
FIG. 6 is a perspective view of a different embodiment of the memory module card adapter of the invention wherein a 168 pin DIMM is coupled to a mother board via two parallel 72 pin sockets.

FIG. 6 is a perspective view of a different embodiment of the present invention wherein a JEDEC standard 168 pin DIMM socket 51 is mounted on a memory module adapter card 50 such that it may be coupled to two JEDEC standard 72 pin SIMM sockets 52 and 53 mounted on a computer system or mother board 54. Although these sockets 52 and 53 are shown as generally parallel, it should be noted that the socket arrangement can be otherwise. For example, socket 53 could be at angle to or perpendicular to socket 52.

The memory module card adapter 50 is again in the form of a printed card carrying not only a standard JEDEC 168 pin DIMM socket 51 but also a standard JEDEC 72 pin SIMM socket 55.

A flex circuit 58, well known to the prior art, having ends 58a and 58b designed to engage standard 72 pin SIMM sockets is used to interconnect the SIMM sockets 53 and 55. This flex circuit 58 is shown with end 58a positioned to plug into SIMM socket 55, carried on the memory module card adapter 50, and the other end 58b positioned to engage SIMM socket 53 on the system board 54. This flex circuit 58 directly connects each contact in SIMM socket 53 to its corresponding contact in SIMM socket 55.

One edge 56, of the memory module card adapter 50, has thereon a plurality of pads 57 thereon. These pads have a pitch identical to the pitch of the contacts in SIMM socket 52 over which card 50 is shown positioned.

From each pad 57 there extends a respective wire 59a which is connected, at its other or terminal end, to selected contacts in the DIMM socket 51. These wires 59a connect the contacts in SIMM socket 52 to selected contacts in the DIMM socket 51 in the manner discussed above in FIGS. 1 to 3.

In this embodiment, there are further wires 59 connecting the contacts in SIMM socket 55 to other selected contacts in the DIMM socket 51 in a manner similar to that especially described above in FIGS. 1 to 5.

Figure 7:
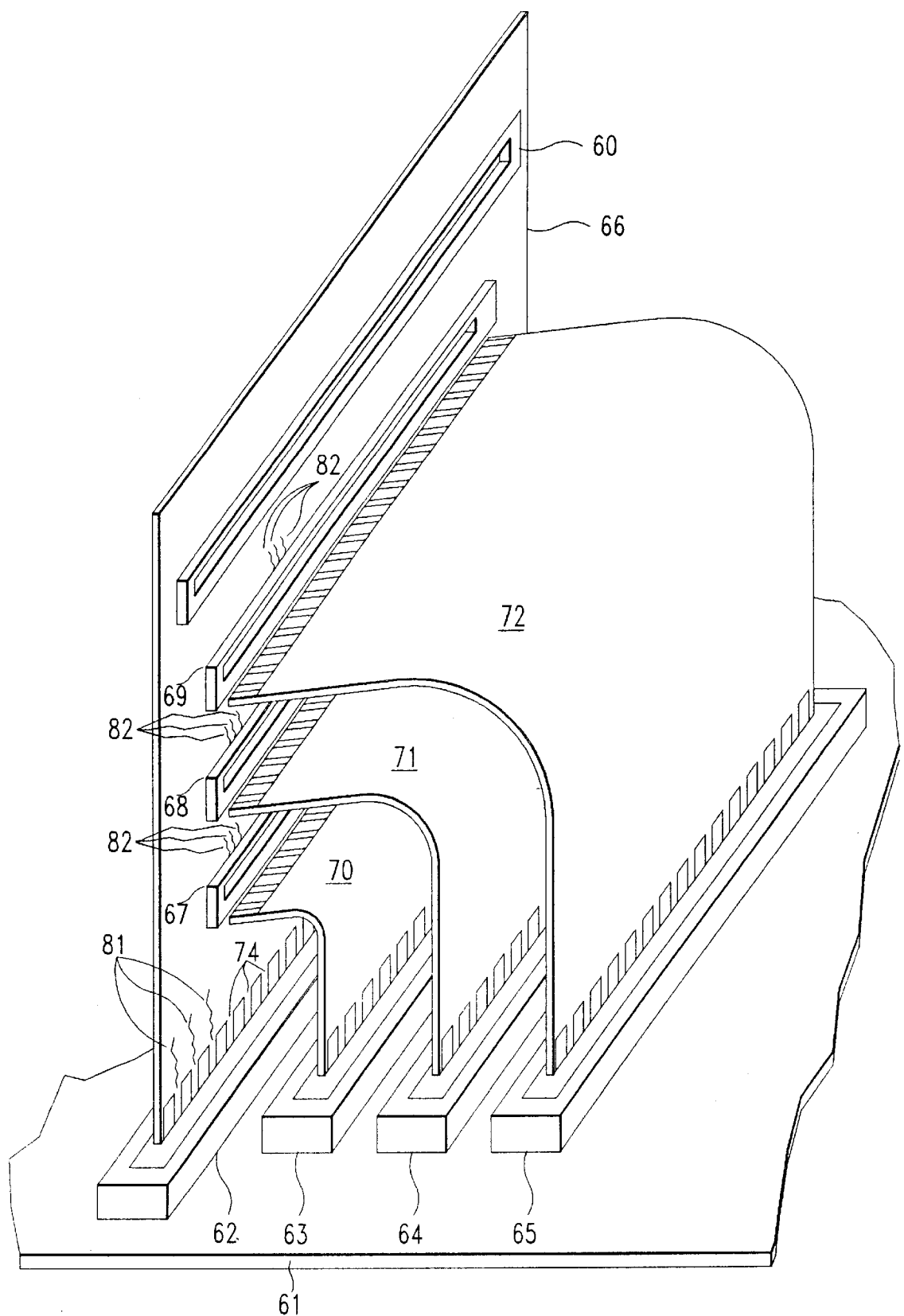
FIG. 7 is a perspective view of a memory module card adapter that incorporates the features of the present invention and couples a 72 pin SIMM to a mother board having four 30 pin SIMM sockets thereon.

FIG. 7 is a perspective view of a different embodiment of the present invention for coupling a JEDEC standard a 72 pin SIMM 60 to a computer system or mother board 61 having four 30 pin SIMM sockets 62, 63, 64, and 65 thereon.

This embodiment of the invention, is again in the form of a printed card 66 carrying a standard JEDEC 72 pin SIMM socket 60 and three standard JEDEC 30 pin SIMM sockets 67, 68, and 69. One edge, of the memory module card adapter 66, has thereon a plurality of pads 74 thereon. These pads 74 have a pitch identical to the pitch of the contacts in the 30 SIMM socket 62.

Flex circuits 70, 71, and 72, well known to the prior art, having both of their ends designed to engage standard 30 pin SIMM sockets is used to interconnect the SIMM sockets 63, 64, and 65 to SIMM sockets 67, 68, and 69 respectively. These flex circuits 70, 71, and 72, when inserted into the respective SIMM sockets on the memory module adapter card 66 and system board 61, directly connect each contact in a SIMM socket on the board to a corresponding contact in a SIMM socket on the card.

The printed circuit card forming the memory module card adapter 66 is, in this embodiment, again provided with pads 74 from each of which there extends a respective wire 81 which is connected, at its other or terminal end, to selected contacts in the 72 pin SIMM a socket 60.

Other similar wires 82 connect the contacts in the 30 pin SIMM sockets 67, 68 and 69 to other selected contacts in the 72 pin SIMM socket 60 in a manner similar to that described above.

While the invention has been particularly described with respect to a preferred embodiment and several variations thereon, it should be understood that one skilled in the art can, from the foregoing, readily make further changes in form and detail without departing from the spirit and scope of the invention.

What is claimed is:

1. In a computer:
   a system board having first and second single inline memory module (SIMM) connector sockets, having a plurality of spaced contacts therein, mounted thereon; and
   a memory module adapter comprising;
   a printed circuit card having a plurality of contact pads arranged on one edge thereof, the number and spacing of the contact pads being equal to or smaller than the number and spacing of the spring contacts in a single inline memory module (SIMM) connector socket on said system board;
   said edge of said printed circuit card and said contact pads being inserted into said first single inline memory module (SIMM) connector socket;
   a dual inline memory module (DIMM) connector socket, having a plurality of fixed spring contacts greater in number than the plurality of fixed spring contacts in a single inline memory module (SIMM) connector socket on said system board;
   a first set of wires having first and second ends disposed on said printed circuit card;
   each wire of said first set of wires having a first end connected to a respective one of said contact pads arranged on said one edge of said printed circuit card and a second end terminating at and connected to a respective spring contact in said dual inline memory module (DIMM) connector socket on said printed circuit card;
   a third single inline memory module (SIMM) connector socket, having a plurality of fixed spring contacts equal in number to the said plurality of contact pads, mounted on said printed circuit card;
   a second set of wires having first and second ends disposed on said printed circuit card;
   each wire of said second set of wires having a first end connected to a respective one of said spring contacts in said third single inline memory module (SIMM) connector socket and a second end terminating at and connected to a respective spring contact in said dual inline memory module (DIMM) connector socket; and
   flexible connector means connecting the spring contacts in said third single inline memory module (SIMM) connector socket to said second single inline memory module (SIMM) connector socket mounted on said system board whereby when a dual inline memory module (DIMM) is inserted in said dual inline memory module (DIMM) connector socket on said card and said edge is electrically inserted in a single inline memory module socket on said system board and said third single inline memory module (SIMM) connector socket is electrically coupled to said second single inline memory module (SIMM) connector socket through said flexible connector means the dual inline memory module (DIMM) is electrically coupled to said system board as two single inline memory modules (SIMMs).

2. In a computer:
   a system board with a plurality of single inline memory module (SIMM) connector sockets mounted thereon;

each single inline memory module (SIMM) connector socket having a plurality of spaced contacts therein; and a memory module adapter comprising;

a printed circuit card, a plurality of contact pads arranged in two sets on one edge of said printed circuit card, each set having a spacing adapted to mate with the spaced contacts in said single inline memory module (SIMM) connector sockets on said system board; and each of said sets of contact pads being inserted into respective single inline memory module (SIMM) connector sockets;

a dual inline memory module (DIMM) connector socket affixed to said printed circuit card, said dual inline memory module (DIMM) connector socket having a plurality of spaced spring contacts greater in number than the number of said spring contact pads on a single inline memory module (SIMM) connector socket mounted on said system board;

a plurality of wires having first and second ends disposed on said printed circuit card;

each of said plurality of wires having a first end connected to a respective one of said pads in a respective one of said sets and a second end terminating at and connected to a respective spring contact in said dual inline memory module connector socket.

3. The memory module card adapter of claim 2 wherein;

said single inline memory module connector sockets are adjacent;

said printed circuit card has said one edge split into two parts by a slot extending into said printed circuit card whereby each of said parts can be inserted into respective one of adjacent single inline memory module connector sockets mounted on said system board.

4. In a computer:

a system board having a plurality of single inline memory module (SIMM) connector sockets mounted thereon; and a memory module adapter comprising;

a printed circuit card having one edge adapted for insertion into a single inline memory module (SIMM) connector socket mounted on the system board in said computer;

a dual inline memory module (DIMM) connector socket affixed to said printed circuit card, said dual inline memory module (DIMM) connector socket having a plurality of spaced spring contacts thereon;

a single inline memory module (SIMM) connector socket affixed to said printed circuit card, said single inline memory module connector socket having a plurality of spaced spring contacts thereon;

a plurality of contact pads, having a spacing adapted to mate with contacts in a single inline memory module connector socket, arranged on said one edge of said printed circuit card; and two sets of wires having first and second ends disposed on said printed circuit card;

each wire in said first set having a first end connected to a respective one of said pads on said one edge and a second end terminating at and connected to a respective spring contact in said dual inline memory module connector socket;

each wire in said second set having a first end connected to a respective one of said contacts in said single inline memory module connector socket affixed to said printed circuit card and a second end terminating at and connected to a respective spring contact in said dual inline memory module (DIMM) connector socket.

5. The memory module card adapter of claim 1 wherein:

each of said single inline memory module (SIMM) connector sockets has more than 29 and less than 75 spaced contacts therein; and said dual inline memory module (DIMM) connector sockets has more than 75 spaced contacts therein.

\* \* \* \* \*